(12) United States Patent
Groeneweg

(10) Patent No.: US 8,456,232 B2
(45) Date of Patent: Jun. 4, 2013

(54) ELECTRONIC CIRCUIT

(75) Inventor: Willem H. Groeneweg, Breingarten (CH)

(73) Assignee: NXP B.V., Eindhoven (NL)

( * ) Notice: Subject to any disclaimer, the term of this patent is extended or adjusted under 35 U.S.C. 154(b) by 204 days.

(21) Appl. No.: 13/063,187

(22) PCT Filed: Sep. 7, 2009

(86) PCT No.: PCT/IB2009/053889
§ 371 (c)(1),
(2), (4) Date: May 5, 2011

(87) PCT Pub. No.: WO2010/029486
PCT Pub. Date: Mar. 18, 2010

(65) Prior Publication Data
US 2011/0199124 A1  Aug. 18, 2011

(30) Foreign Application Priority Data

Sep. 10, 2008  (EP) .................................... 08105294

(51) Int. Cl.
G06G 7/12 (2006.01)
G01R 19/00 (2006.01)
(52) U.S. Cl.
USPC .......................................... 327/563; 327/359
(58) Field of Classification Search
USPC .................... 327/359, 563; 330/250, 253, 255
See application file for complete search history.

(56) References Cited

U.S. PATENT DOCUMENTS

| 5,416,484 | A | 5/1995 | Lofstrom |
| 5,512,848 | A | 4/1996 | Yaklin |
| 5,528,185 | A | 6/1996 | Lewicki et al. |
| 5,587,682 | A * | 12/1996 | Colli et al. ................... 327/357 |
| 6,087,873 | A | 7/2000 | Alexander |
| 7,208,980 | B2 | 4/2007 | Mulder |
| 7,375,559 | B1 | 5/2008 | Cho et al. |
| 2007/0040587 | A1 | 2/2007 | Chatal |

FOREIGN PATENT DOCUMENTS

EP  1 758 249 A1  2/2007

OTHER PUBLICATIONS

Groeneweg, W., "Analog Signal Processing for a Class D Audio Amplifier in 65 µm CMOS Technology", IEEE Solid-State Circuits Conf., pp. 322-325 (Nov. 18, 2008).
International Search Report and Written Opinion for International Patent Appln. No. PCT/IB2009/053889 (Feb. 25, 2010).
Design Tutorial entitled "CMOS Comparator" retrieved from webpage at http://webpages.eng.wayne.edu/cadence/ECE7570/doc/comparator.pdf, 24 pgs. (undated).

* cited by examiner

Primary Examiner — Hai L Nguyen

(57) ABSTRACT

An electronic circuit comprises an input stage and a driver stage. The input stage comprises first, second, third and fourth inputs, and is configured to generate a first intermediate signal which is the sum or the weighted sum of the first and third input signals, and a second intermediate signal which is the sum or the weighted sum of the second and fourth input signals. The driver stage comprises an output, is configured to generate an output signal present at the output, and is configured to directly compare the first and second intermediate signals such that the output signal indicates which of the two intermediate signals is larger.

14 Claims, 1 Drawing Sheet

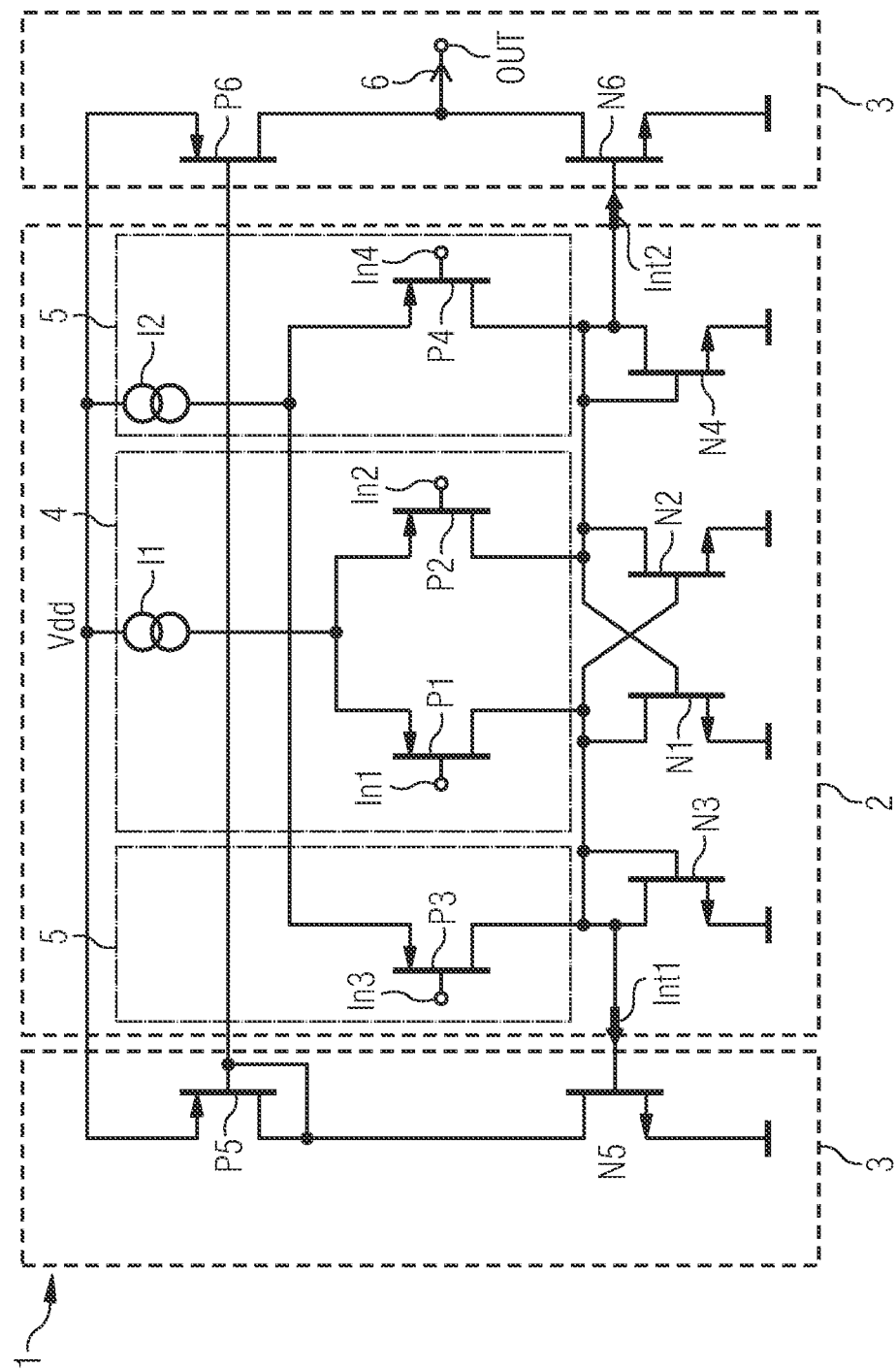

ELECTRONIC CIRCUIT

FIELD OF THE INVENTION

The invention relates to an electronic circuit.

BACKGROUND OF THE INVENTION

A conventional Class D output stage as, for instance, M. Berkhout discloses in "An Integrated 200 W Class-D Audio Amplifier", IEEE Journal of Solid-State Circuits, Vol. 38, No. 7, pp. 1198-1206, July 2003 may comprise a differential first operational amplifier as a feedback integrator at the input and a second operational amplifier as a trans-conductance amplifier as a second stage. The first operational amplifier constitutes a low impedance output stage configured to drive a feedback capacitor. The first operational amplifier compares a differential input signal with the output signal of the entire circuit and integrates a resulting error signal which is further integrated by the second operational amplifier.

The conventional Class D output stage may further comprise feed-forward analog adder stages following the second operational amplifier and securing stability. The adder stages add the output signals of the first and second operational amplifiers. Comparators following the adder stages compare the output signals of the adder stages with, for instance, a triangular wave form and drive power output stages.

OBJECT AND SUMMARY OF THE INVENTION

It is an object of the present invention to provide an improved electronic circuit comprising analog adding and comparator capability.
The object is achieved in accordance with the invention by means of an electronic circuit, comprising an input stage comprising first, second, third and fourth inputs, and configured to generate a first intermediate signal which is the sum or the weighted sum of the first and third input signals, and a second intermediate signal which is the sum or the weighted sum of the second and fourth input signals, and a driver stage comprising an output, configured to generate an output signal present at the output, and configured to directly compare the first and second intermediate signals such that the output signal indicates which of the two intermediate signals is larger.

The inventive electronic circuit, which may particularly be implemented as an integrated circuit on a single chip, comprises two stages, namely the input and the driver stages. The input stage is configured to generate the intermediate signals which are sums or weighted sums of the input signals of the inventive electronic circuit. The input stage thus implements the functionality of an analog adder.

The inventive circuit further comprises the driver stage which is configured to compare the first and second intermediate signals such that the output signal indicates which of the two intermediate signals is larger. The driver stage thus implements the functionality of a comparator. Since, however, the driver stage directly processes the intermediate signals, i.e. the sums or the weighted sums of the input signals of the electronic circuit, an intermediate stage necessary if a conventional comparator follows a conventional analog adder is omitted. For a conventional circuit arrangement comprised of an analog comparator following an analog adder, the intermediate stage is a differential stage of the comparator further processing the output signal of the analog adder. As a result, the inventive electronic circuit can be made to need less layout area, to generate less offset, to be faster, and/or to consume less electric power than a conventional circuit arrangement.

The input stage may comprise a first differential stage including the first and second inputs and powered by a first current source, a second differential stage including the third and fourth inputs and powered by a second current source different from the first current source, a first load coupled through the first and second differential stages to the first and third inputs such that the first intermediate signal is present at the first load, and a second load coupled through the first and second differential stages to the second and fourth inputs such that the second intermediate signal is present at the second load. The two differential stages may, for instance, comprise a pair of transistors each and the two loads may be formed by resistors or preferably by transistors. Conventional comparators, as discussed above, include a differential stage which is powered by a current source. The sum of the current values of the two current sources of the inventive electronic circuit may essentially equal to the current value of the current source of a conventional analog comparator.

The first load may comprise first and second transistors connected in parallel and the second load may comprise third and fourth transistors connected in parallel, wherein the second and fourth transistors are connected in a cross-coupled manner. The second and fourth transistors connected in the cross-coupled manner may particularly have a smaller width than the first and third transistors of the two loads. The second and fourth transistors can provide a voltage gain in the input stage such that the value of the two intermediate signals is increased.

The two differential stages may essentially be identical and the first and second current sources may provide currents essentially having identical values.
In one embodiment of the inventive electronic circuit, the differential stages have different input sensitivities and/or the first and second current sources provide currents of different values. Then, the inventive electronic circuit provides for a gain difference between the different inputs.

The driver stage may comprise a first cascaded inverter whose input signal is the first intermediate signal and a second cascaded inverter whose input signal is the second intermediate signal. The first cascaded inverter may particularly be directly coupled to the first load such that the first intermediate signal is fed directly to the first cascaded inverter, and the second cascaded inverter may particularly be directly coupled to the second load such that the second intermediate signal is fed directly to the second cascaded inverter. Since the intermediate signals are directly fed to the two cascaded inverters by, for instance, directly coupling the two loads to the cascaded inverters, the inverters realize driver and comparator functionalities. Thus, as discussed above, the inventive electronic circuit does not comprise and does not need an intermediate stage, such as a further differential stage needed if a conventional analog comparator follows a conventional analog adder.

The first cascaded inverter may be comprised of two transistors each comprising a gate of which one is directly coupled to the first load, and the second cascaded inverter may be comprised of two transistors each comprising a gate of which one is directly coupled to the second load. The other gates of the transistors of the first and second cascaded inverters may be connected together and the output of the inventive electronic circuit may directly be coupled to one of the two cascaded inverters.

BRIEF DESCRIPTION OF THE DRAWINGS

The invention will be described in greater detail hereinafter, by way of a non-limiting example, with reference to the embodiment shown in the drawing, wherein the FIGURE is a block diagram of an electronic circuit having integrated analog adding and comparator capability.

DESCRIPTION OF EMBODIMENTS

The FIGURE is a block diagram of an electronic circuit 1 having combined analog adding and comparator capability.

The electronic circuit 1, which is embodied as an integrated circuit, comprises two stages, namely an input stage 2 and a driver stage 3 immediately following the input stage 2. The input stage 2 comprises first, second, third and fourth inputs In1, In2, In3, In4 and the driver stage 3 comprises an output OUT which is also the output of the electronic circuit 1.

For the exemplary embodiment, the input stage 2 comprises a first differential stage 4 and a second differential stage 5. The first differential stage 4 comprises the first and second inputs In1, In2, and first and second transistors P1, P2 which are implemented in MOS technology, are of the p-type and whose sources are connected to a first current source I1. The first input In1 is connected to the gate of the first transistor P1 and the second input In2 is connected to the gate of the second transistor P2.

The second differential stage 5 comprises for the exemplary embodiment the third and fourth inputs In3, In4, and third and fourth transistors P3, P4 which are implemented in MOS technology, are of the p-type and whose sources are connected to a second current source I2. The third input In3 is connected to the gate of the third transistor P3 and the fourth input In4 is connected to the gate of the fourth transistor P4. The two current sources I1, I2 generate essentially constant currents of different values and the sensitivities of the first and second differential stages 4, 5 differ as well. The two current sources I1, I2 are powered by a voltage Vdd generated by a voltage source not explicitly shown in the FIGURE.

For the exemplary embodiment, the input stage 2 further comprises first and second feed-forward loads. The first feed-forward load is comprised of a transistor N1 and a transistor N3 connected in parallel. The transistors N1, N3 are implemented in MOS technology, are of the n-type, their drains are connected to the drains of the first transistor P1 of the first differential stage 4 and the third transistor P3 of the second differential stage 5, and the transistor N1 has a smaller width than that of transistor N3. The second feed forward load is comprised of a transistor N2 and a transistor N4 connected in parallel. The transistors N2, N4 are implemented in MOS technology, are of the n-type, their drains are connected to the drains of the second transistor P2 of the first differential stage 4 and the fourth transistor P4 of the second differential stage 5, and the transistor N2 has a smaller width than that of transistor N4. The sources of the transistors N1-N4 of the two feed-forward loads are connected to ground, the gate and the drain of the transistor N3 is short circuited, and the gate and the drain of the transistor N4 is short circuited. Additionally, the transistors N1, N2 are connected in cross-coupled manner such that the gate of transistor N1 is connected to the drains of the second transistor P2 of the first differential stage 4 and the fourth transistor P4 of the second differential stage 5 and the gate of transistor N2 is connected to the drains of the first transistor P1 of the first differential stage 4 and the third transistor P3 of the second differential stage 5. Consequently, a first intermediate signal Int1 which is the sum or a weighted sum of the signals fed to the first and third inputs In1, In3 is present at the first feed-forward load and particularly at the drains of transistors N1, N3, and a second intermediate signal Int2 which is the sum or a weighted sum of the signals fed to the second and fourth inputs In2, In4 is present at the second feed-forward load and particularly at the drains of transistors N2, N4.

The first and second intermediate signals Int1, Int2 are the input signals for the driver stage 3. For the exemplary embodiment, the driver stage 3 comprises two cascaded inverters each comprising a pair of transistors N5, P5, N6, P6. Each cascaded inverter comprises a p-type transistor P5, P6 and an n-type transistor P5, P6. The drains of the transistors P5, N5 are coupled and the drains of the transistors P6, N6 are coupled and form the output OUT of the electronic circuit 1. The sources of the n-type transistors N5, N6 are connected to ground and the sources of the p-type transistors P5, P6 are coupled to the voltage Vdd. Furthermore, the drain and the gate of transistor P5 are short circuited and the gates of the p-type transistors P5, P6 are connected.

For the exemplary embodiment, the drains of the transistors N1, N3 of the input stage 2 are connected to the gate of the n-type transistor N5 of the driver stage 3. Thus, the gate of the n-type transistor N5 of the driver stage 3 is one of its inputs and accepts the first intermediate signal Int1. The drains of the transistors N2, N4 of the input stage 2 are connected to the gate of the n-type transistor N6 of the driver stage 3. Thus, the gate of the n-type transistor N6 of the driver stage 3 is the other of its inputs and accepts the second intermediate signal Int2. As a result, the driver stage 3 immediately follows the input stage 2 and is configured to directly compare the first and second intermediate signals Int1, Int2 such that an output signal 6 of the electronic circuit 6 present at its output OUT indicates which of the two intermediate signals Int1, Int2 is larger.

For the exemplary embodiment, the signals present at the inputs In1, In3 or the inputs In2, In4 may be the same and function as a reference signal.

Finally, it should be noted that the aforementioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The word "comprising" and "comprises", and the like, does not exclude the presence of elements other than those listed in any claim or the specification as a whole. The singular reference of an element does not exclude the plural reference of such elements and vice-versa. The mere fact that certain measures are recited in mutually different dependent claims does not indicate that a combination of these measures cannot be used to advantage.

The invention claimed is:

1. An electronic circuit, comprising
an input stage comprising first, second, third, and fourth inputs, and configured to generate a first intermediate signal which is weighted sum of the first and third input signals, and a second intermediate signal which is a weighted sum of the second and fourth input signals;
a driver stage comprising an output, configured to generate an output signal present at the output and directly compare the first and second intermediate signals such that the output signal indicates which of the two intermediate signals is larger, a first cascaded inverter receiving the first intermediate signal at a gate of the first cascaded inverter and a second cascaded inverter receiving the second intermediate signal at a gate of the second cascaded inverter.

2. The electronic circuit of claim 1, wherein the input stage comprises:

a first differential stage including the first and second inputs and powered by a first current source;

a second differential stage including the third and fourth inputs and powered by a second current source different from the first current source;

a first load coupled through the first and second differential stages to the first and third inputs such that the first intermediate signal is present at the first load; and a second load coupled through the first and second differential stages to the second and fourth inputs such that the second intermediate signal is present at the second load.

3. The electronic circuit of claim 2, wherein the first load comprises first and second transistors connected in parallel, the second load comprises third and fourth transistors connected in parallel, and the second and fourth transistors are connected in a cross-coupled manner.

4. The electronic circuit of claim 3, wherein a width of the second and fourth transistors is less than a width of the first and third transistors.

5. The electronic circuit of claim 2, wherein at least one of the differential stages have different input sensitivities and the first and second current sources provide currents of different values.

6. The electronic circuit of claim 2, wherein the first cascaded inverter is directly coupled to the first load such that the first intermediate signal is fed directly to the first cascaded inverter, and the second cascaded inverter is directly coupled to the second load such that the second intermediate signal is fed directly to the second cascaded inverter.

7. The electronic circuit of claim 6, wherein the first cascaded inverter comprises:

two transistors each comprising a gate of which one is directly coupled to the first load, and the second cascaded inverter comprises:

two transistors each comprising a gate of which one is directly coupled to the second load.

8. The electronic circuit of claim 7, wherein the other gates of the transistors of the first cascaded inverter and the second cascaded inverter are connected together.

9. The electronic circuit of claim 1, wherein the driver stage comprises:

a first cascaded inverter whose input signal is the first intermediate signal; and a second cascaded inverter whose input signal is the second intermediate signal.

10. The electronic circuit of claim 9, wherein the output is directly coupled to one of the cascaded inverters.

11. The electronic circuit of claim 1, wherein the output signal is generated by coupled drains of the second cascaded inverter.

12. The electronic circuit of claim 1, wherein each cascaded inverter comprises a p-type transistor and an n-type transistor.

13. The electronic circuit of claim 12, wherein a drain and a gate of the p-type transistor of the first cascaded inverter are short-circuited.

14. An electronic circuit, comprising an input stage comprising first, second, third, and fourth inputs, and configured to generate a first intermediate signal which is weighted sum of the first and third input signals, and a second intermediate signal which is a weighted sum of the second and fourth input signals, wherein the input stage further comprises:

a first differential stage including the first and second inputs and powered by a first current source;

a second differential stage including the third and fourth inputs and powered by a second current source different from the first current source;

a first load coupled through the first and second differential stages to the first and third inputs such that the first intermediate signal is present at the first load; and a second load coupled through the first and second differential stages to the second and fourth inputs such that the second intermediate signal is present at the second load, wherein the first load comprises first and second transistors connected in parallel, the second load comprises third and fourth transistors connected in parallel, and the second and fourth transistors are connected in a cross-coupled manner wherein a first cascaded inverter is directly coupled to the first load such that the first intermediate signal is fed directly to the first cascaded inverter, and a second cascaded inverter is directly coupled to the second load such that the second intermediate signal is fed directly to the second cascaded inverter, wherein the first cascaded inverter comprises two transistors each comprising a gate of which one is directly coupled to the first load, and the second cascaded inverter comprises two transistors each comprising a gate of which one is directly coupled to the second load, and wherein the other gates of the transistors of the first cascaded inverter and the second cascaded inverter are connected together; and a driver stage comprising an output, configured to generate an output signal present at the output and directly compare the first and second intermediate signals such that the output signal indicates which of the two intermediate signals is larger, wherein the driver stage further comprises a first cascaded inverter receiving the first intermediate signal at a gate of the first cascaded inverter and a second cascaded inverter receiving the second intermediate signal at a gate of the second cascaded inverter.

* * * * *